(12) United States Patent
Iwasaki

(10) Patent No.: US 6,717,426 B2
(45) Date of Patent: Apr. 6, 2004

(54) BLADE-LIKE CONNECTING NEEDLE

(75) Inventor: Yukoh Iwasaki, Tokyo (JP)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/074,202

(22) Filed: Feb. 12, 2002

(65) Prior Publication Data

US 2002/0149386 A1 Oct. 17, 2002

(30) Foreign Application Priority Data

Apr. 13, 2001 (JP) .......................... 2001-114861

(51) Int. Cl.[7] .............................................. G01R 1/073
(52) U.S. Cl. ......................... 324/762; 324/754
(58) Field of Search .......................... 324/762, 754, 324/758, 761, 765

(56) References Cited

U.S. PATENT DOCUMENTS

| 4,116,523 A | * | 9/1978 | Coberly et al. ............. 324/754 |
| 4,161,692 A | | 7/1979 | Tarzwell ...................... 324/754 |

* cited by examiner

Primary Examiner—Ernest F. Karlsen

(57) ABSTRACT

A blade-like connecting needle for measuring a semiconductor wafer has an increased capability for measuring a small current and also has stable characteristics. The blade-like connecting needle includes a blade signal line for transmitting signal from the semiconductor wafer, a support insulator covering at least a portion of the blade signal line, a plurality of blade guard patterns disposed in or on the support insulator for electromagnetically shielding the blade signal line, and a probe supported on the support insulator and connected to the blade signal line. There are also disclosed processes of producing the blade-like connecting needle. A method for manufacturing a coaxial or hollow blade-like connecting needle is also provided.

5 Claims, 10 Drawing Sheets

BLADE-LIKE CONNECTING NEEDLE

BACKGROUND OF THE INVENTION

1. Field of the Invention

The present invention relates to a blade-like connecting needle for use on a probe card as a probing equipment or a contact probe for connecting a measuring unit to a semiconductor wafer for making measurement on the semiconductor wafer, and more particularly to a blade-like connecting needle for use on a probe card, which is capable of stably and greatly reducing a measurement waiting time that serves as an important factor in measuring a small current.

2. Description of the Related Art

One conventional probe card is shown in the plan in view of FIG. 10 among the accompanying drawings, and a portion of the conventional probe card for connection to a semiconductor wafer is shown at an enlarged scale in FIG. 11. A current measurement signal electrode and a guard electrode which extend from a measuring unit are connected downwardly to respective pads A and B shown in FIG. 11 via pogo pins. The pad A is electrically connected to pads F and G, but insulated from the pad B, which is positioned outwardly of the pad A. A signal line connected to the pad A extends via a cable to a needle mount area D, where it is connected to a probe needle of certain shape. The probe needle is connected to desired electrodes on a semiconductor wafer. The needle mount area D generally has single-core needles, coaxial needles, or blade-like connecting needles. FIGS. 12 through 15 of the accompanying drawings show conventional blade-like connecting needles at an enlarged scale in the needle mount area D on the probe card shown in FIG. 11. FIGS. 14 and 15 show in perspective one of the conventional blade-like connecting needles as viewed from respective opposite sides. Signal lines 114 (FIG. 12) from the measuring unit are connected to blade signal lines 111 shown in FIG. 15, which are connected to signal patterns 120 on tip ends of the blade-like connecting needles. The signal patterns 120 are connected by soldering to respective probes 116 that are held in contact with desired electrodes on a semiconductor wafer. In FIGS. 14 and 15, guard patterns 112 (112a, 112b, 112c) are disposed to cover substantially entirely two faces 112b, 112c and a portion of one face 112a of the blade-like connecting needle. The guard pattern 112b, which may be viewed as a bottom surface of the blade-like connecting needle, is fixed by soldering to the needle mount area guard pattern 113 (FIG. 12) on a probe card 117. The blade-like connecting needles are held in one-to-one correspondence to channels of the measuring unit. If counter measures against problems associated with small currents and noise are required, the patterns 112 are provided between the blade signal lines 111 and another potential, and connected to the respective pads B (FIG. 11). The guard patterns 112 may extend from one side of a blade body 115 which is made of an insulating material, on which the signal line 111 is placed, to an opposite side of the blade body 115. The guard patterns 112 serve to prevent a current from flowing from or into the signal lines 111 to another potential via the surface of the probe card substrate insulator 117, for example.

Preferably, an active guard whose potential is maintained at the same level as the potential of the signal line 111 is usually used as the guard, no signal current leaks from or into the signal line via the guard patterns to or from another potential. Any dielectric absorption due to the insulator between the signal line and the guard does not occur because the potential difference is nil. Therefore, the measurement of a small current can instantaneously be started when a certain voltage is applied to the signal line.

Even when a passive guard for fixing the guard potential to a certain fixed potential at all times is employed, some advantageous effect can be expected. As shown in FIG. 12, as "another patnetial" to a particular signal line, the lower guard pattern belonging to an adjacent signal line channel, and, in addition, many signal lines, guard patterns, and patterns providing other potentials are present at a high density.

As can be seen from FIG. 12, the signal line 111 is disposed and exposed on the surface of the blade body 115 in the conventional structure. If a small current on the order of fA is to be measured, a measurement waiting time is long because of a dielectric absorption current caused by the insulator between the signal line and the other potential pattern having a different potential. In the presence of a capacitive coupling to other potential patterns, a longer measurement waiting time is needed due to the time required to charge the capacitance. The capacitive coupling should desirably be eliminated in view of possible fluctuations of other potentials and a possible superposition of noise.

Japanese laid-open patent publication No. 8-330369 discloses an attempt to place the needle mount area D in a lower trenched position for preventing different potential present in other parts of the system from being directly "seen" by the signal line, and to position guard patterns on side faces of the trench. The disclosed attempt provides good results. However, since the disclosed attempt requires complex processing on the probe card substrate insulator 117, it is difficult and costly to produce a high-density blade package.

The above characteristics will be described on the basis of an equivalent circuit. An equivalent circuit of the structure shown in FIG. 12 is illustrated in FIG. 16. For the sake of brevity, a dielectric absorption term is modeled by a linear approximation. As also shown in FIG. 15, a signal line terminal 60 in FIG. 16 corresponds to the signal line 111, a guard terminal 62 to the guard patterns 112 (112a, 112b, 112c), and a terminal 64 having a different potential to an adjacent channel pattern. For an active guard, since the signal line terminal 60 and the guard terminal 62 are always held at the same potential, they may be considered as being short-circuited. Thus, only the other potential terminal 64 corresponding to the adjacent channel pattern may be considered from the terminal 60. It is assumed that the terminal 64 of differing potential has a certain constant potential and the potential of the signal terminal 60 changes stepwise with respect to the potential of terminal 64. Since the charging and discharging of a capacitive component C3 is finished instantaneously, it does not pose any problem on a settling time. However, the time constant of a resistive component R4 and a capacitive component C4, which represents a dielectric absorption term, generally shows a large value of several tens of seconds, it takes a very long period of time to measure a small current until an error current value falls into an allowable range. For example, when the terminal voltage of the conventional blade changes by 10 V, it occasionally takes several tens of seconds until the error current value due to the dielectric absorption term falls into a range of the order of fA. Required settling times differ greatly depending on the position of the blade-like connecting needle and the manufacturing lot thereof because of variations in insulator materials. In addition, since the insulator characteristics greatly vary depending on the environmental conditions (temperature and humidity), pollution, etc., the insulator may have poor weather resistance and poor environment resistance. The conventional probe card (a combination of a probe card blank board, wiring cables, and blade-like connecting needles) has been problematic because its specification needs to have a large margin against material variations and environmental conditions. Japanese patent application No. 2000-036636 (Japanese laid-open patent specification No. 2001-231195) reveals an invention relating to a probe card blank board that is improved to solve the above problems and provide substantially ideal characteristics. Therefore, blade-like connecting needles still remain to be improved.

One known solution is to use a coaxial needle instead of a blade-like connecting needle. Using a coaxial needle structure can solve the conventional problem of the large settling time because the signal line is covered with the guard.

However, the coaxial needle which uses a good-quality insulator, typically polytetrafluoroethylene (PTFE), is of poor durability and is highly expensive. Since the durability of the coaxial needle is much lower than other connecting needles, the downtime of the device due to maintenance and repair is longer, resulting in a poorer cost balance. In order to improve the durability and reduce costs, attempts have been made to improve the insulator. However, if no guard can be used, or if a passive guard is used, or if such a use occur prior to the measurement of a small current, then it takes a very long period of time until the signal is settled.

SUMMARY OF THE INVENTION

In order to solve the above problems, there is provided in accordance with the present invention a blade-like connecting needle for measuring a semiconductor wafer, comprising a blade signal line for transmitting signal from the semiconductor wafer, a support insulator covering at least a portion of the blade signal line, a plurality of blade guard patterns disposed in or on the support insulator for electromagnetically shielding the blade signal line, and a probe supported on the support insulator and connected to the blade signal line. At least a portion of the probe may be covered with an insulating material. The blade-like connecting needle may further include a connector for connecting the blade signal line to an external circuit. The connector may include a signal line covered with an insulating material, in at least a portion thereof. The blade-like connecting needle thus constructed is inexpensive, and has an increased capability for measuring a small current and also has stable characteristics.

DETAILED DESCRIPTION OF THE PREFERRED EMBODIMENTS

Figure 1:
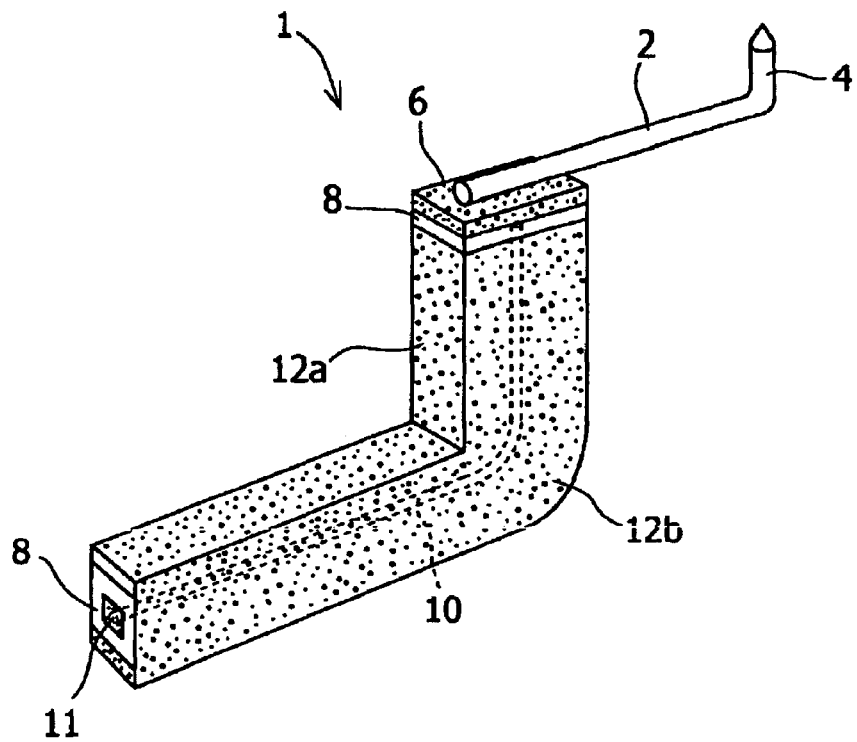
FIG. 1 is a perspective view of a blade-like connecting needle according to the present invention.
Figure 16:
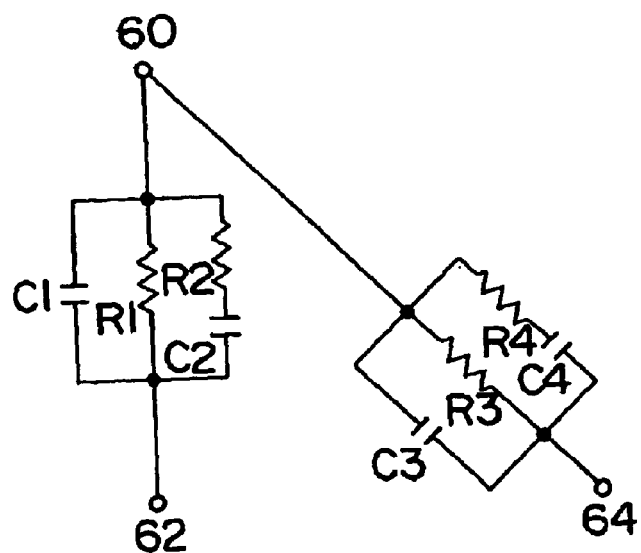
FIG. 16 is a circuit diagram of an equivalent circuit illustrative of a problematic dielectric absorption current of the conventional blade-like connecting needle and a capacitive coupling thereof with another potential.

As shown in FIG. 1, a blade-like connecting needle 1 according to a first embodiment of the present invention has the blade signal line 10 disposed in a blade body thereof, a support insulator 8 covering the blade signal line 10, and a plurality of guard patterns 12a, 12b, 12c, 12d covering the surface of the insulator 8, so as to have a coaxial-type signal line. This is in contrast to the blade signal line 111 exposed on the surface of the blade 115 according to the conventional design. The blade-like connecting needle 1 thus provides an excellent and complete guard environment for minimizing exposure of the signal line and an electric coupling with an adjacent signal line (which corresponds to the coupling between the terminals 60, 64 shown in FIG. 16). The blade-like connecting needle 1 is thus capable of minimizing dielectric absorption and a steady leakage current between itself and another signal line of different potential present near the blade-like connecting needle 1. A signal obtained from a probe 2 by the coaxial blade-like connecting needle 1 is outputted via the blade signal line 10 to a signal output section 11 to which a measuring unit (not shown) is connected.

The blade-like connecting needle 1 is shown as having a rectangular cross-sectional shape, but may have a circular or polygonal cross-sectional shape. The blade-like connecting needle 1 can simply be manufactured by combining insulating materials corresponding to existing blades having signal lines on their surfaces. The probe 2 (which corresponds to the probe 116 shown in FIG. 2) mounted on the tip end of the blade-like connecting needle 1 may comprise the conventional probe or any other probe manufactured according to one of any other known technique. The guard patterns may be produced by depositing films of an electrically conductive material such as metal in or on the insulator by plating, evaporation, or the like. The probe 2 may also be of a coaxial structure produced by covering a signal line with a support insulator and covering the support insulator with guard patterns. Since the coaxial structure reduces the exposure of the signal line of the probe, the characteristics of the probe can be improved.

Figure 2A:
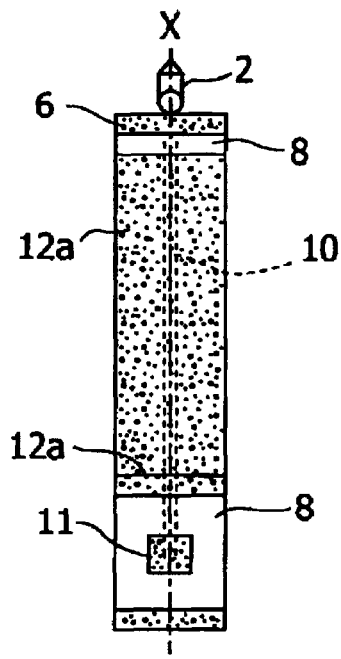
FIGS. 2(a), 2(b), and 2(c) are a front elevational view, a side elevational view, and a bottom view, respectively, of the blade-like connecting needle shown in FIG. 1.
Figure 2B:
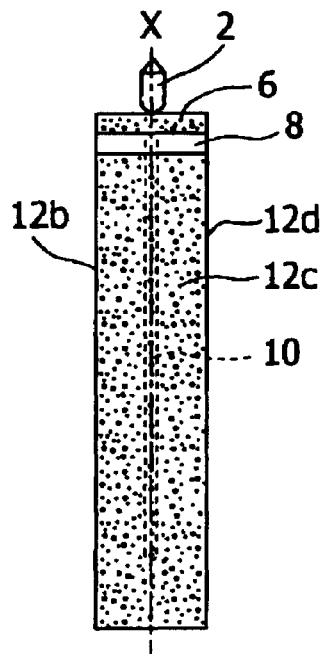
Figure 2C:
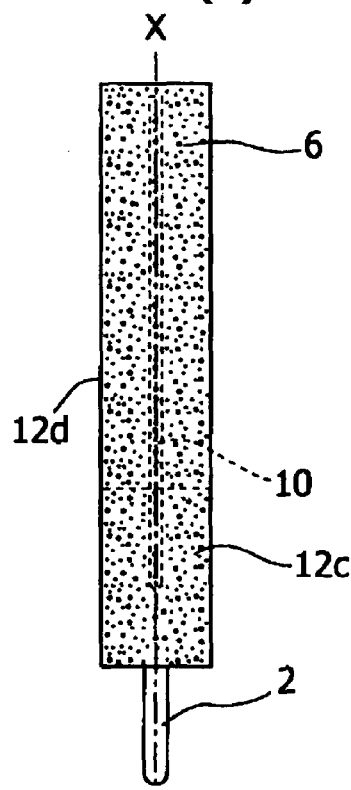
Figure 3:
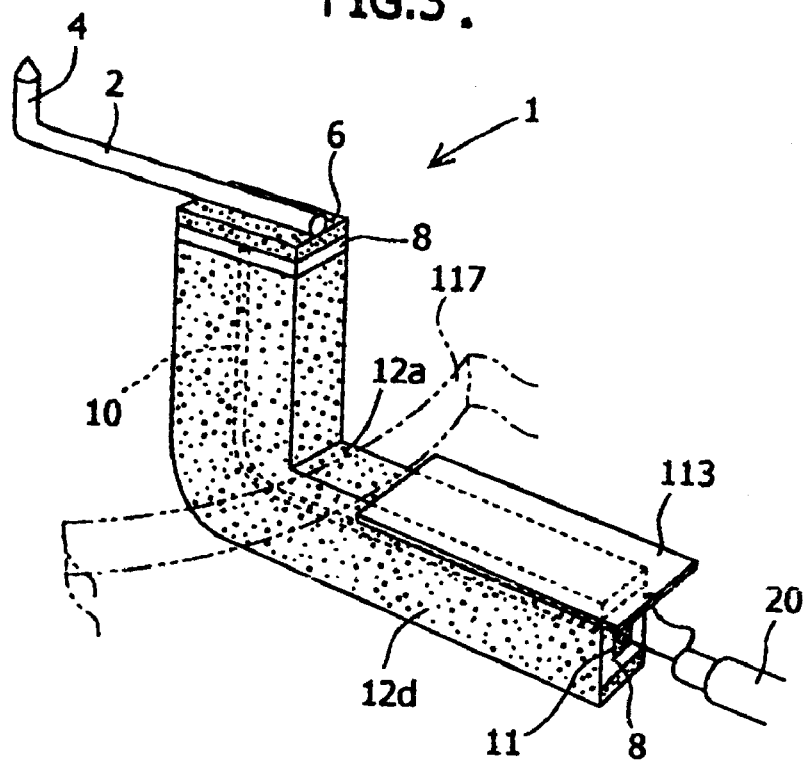
FIG. 3 is a perspective view, as seen from the back of a probe card, of the blade-like connecting needle according to the present invention which is connected by a coaxial cable.

FIGS. 2(a) through 2(c) show the blade-like connecting needle 1 as seen from different directions. Specifically, FIG. 2(a) shows in front elevation the coaxial blade-like connecting needle 1 with the signal output section 11 on its front side. FIGS. 2(b) and 2(c) are side elevational and bottom views, respectively, of the coaxial blade-like connecting needle 1. As shown in FIG. 3, the signal output section 11 connected to the blade signal line 10 is connected to a coaxial cable 20 and a probe card 22, which is connected to a measuring unit (not shown).

A process of producing the blade-like connecting needle 1 according to the present invention will be described below. The blade-like connecting needle 1 is of a symmetrical shape as viewed in front elevation, for example, with respect to an axis X thereof which is indicated by the broken lines. Therefore, the blade-like connecting needle 1 may be produced by defining grooves in two respective members that are separated by the broken-line axis X, and bonding the two members to each other with the blade signal line 10 housed in the grooves.

According to the first embodiment, the blade signal line 10 and the coaxial cable 20 are connected to each other by an exposed aerial wire. However, the blade signal line 10 and the coaxial cable 20 may be connected to each other by a coaxial connector. For example, a coaxial connector may simply be connected to the signal output section 11 of the coaxial blade-like connecting needle 1. Because a conventional blade-like connecting needle is also connected to a coaxial cable by an exposed aerial wire, use of such a coaxial connector in the conventional coaxial blade-like connecting needle is also effective.

Figure 4:
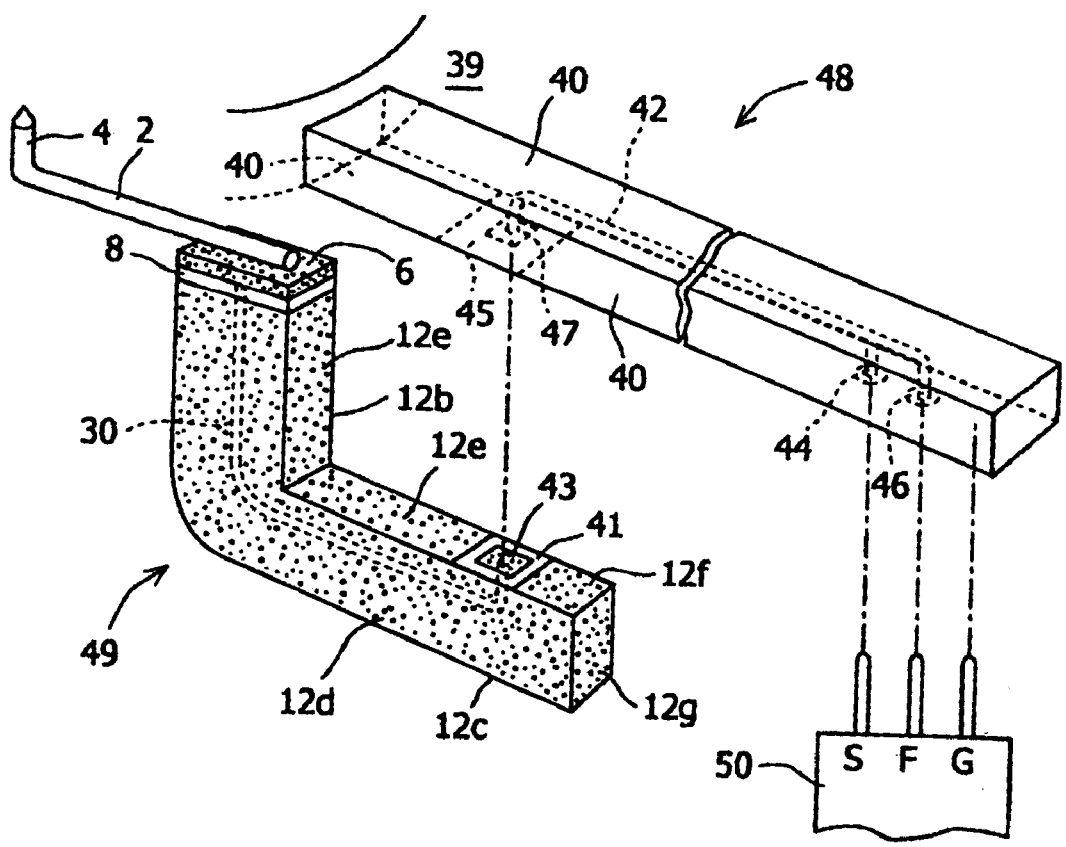
FIG. 4 is a perspective view, as seen from the back of a probe card, of another blade-like connecting needle according to the present invention which is connected by a direct contact assembly rather than a coaxial cable.

FIG. 4 shows a coaxial blade-like connecting needle 49 according to a second embodiment of the present invention. In FIG. 4, the coaxial blade-like connecting needle 49 is used in combination with a shielded electric conductive path 48 on a probe card blank board 39. The coaxial blade-like connecting needle 49 shown in FIG. 4 differs from the coaxial blade-like connecting needle 1 shown in FIG. 1 in that a signal output section 43 of a blade signal line 30 is disposed between guard patterns 12e, 12f on a surface corresponding to the guard pattern 12a shown in FIG. 1. The signal output section 43 is surrounded by an insulating layer 41 in the shielded electric conductive path 48, and is connected to a pogo pin block 50 of a test head by the shielded electric conductive path 48. The shielded electric conductive path 48 is covered with a guard pattern 40 except for exit areas for a signal line 42. The guard pattern 40 is connected as by soldering to guard patterns 12 (12b, 12c, 12d, 12e, 12f, 12g) of the coaxial blade-like connecting needle 49. The signal output section 43 is connected as by soldering to a signal connecting pad 47 on the shielded electric conductive path 48. The signal connecting pad 47 is isolated from the guard pattern 40 by an insulating layer 45. The signal line 42 in the shielded electric conductive path 48 is connected to a sense connecting pad 44 and a force connecting pad 46 which are connected to a measuring unit (not shown) respectively through a sense terminal S and a force terminal F of the pogo pin block 50. The guard pattern 40 is connected to a guard terminal G of the pogo pin block 50 and held at a guard potential according to the guard technique used. Preferably, an active guard is employed to keep the guard terminal G at substantially the same potential as the sense terminal S and the force terminal F. With the above arrangement, the coaxial blade-like connecting needle 49 shown in FIG. 4 has a smaller exposed signal line area than the coaxial blade-like connecting needle 1 shown in FIG. 3 for improved characteristics.

The shielded electric conductive path 48 on the probe card blank board 39 is in accordance with one of the embodiments (wiring is provided on one general-purpose PC board) described in Japanese patent application No. 2000-036636 (Japanese laid-open patent publication No. 2001-231195), and the blade-like connecting needle according to the present invention can be used in combination with the shielded electric conductive path 48. In the present embodiment, the support insulator 8 between the blade signal line 10 and the guard patterns 12a, 12b, 12c is not limited to any materials. The support insulator 8 may be made of a ceramic material having relatively good dielectric characteristics which is used in the conventional blade-like connecting needle. If no guard can be used with conventional insulating materials or if a passive guard is used, then a suitable insulator having desired characteristics may be used. As described above in the first embodiment, the probe 2 may be covered with the support insulator 8 or any of other suitable insulating materials.

Figure 5A:
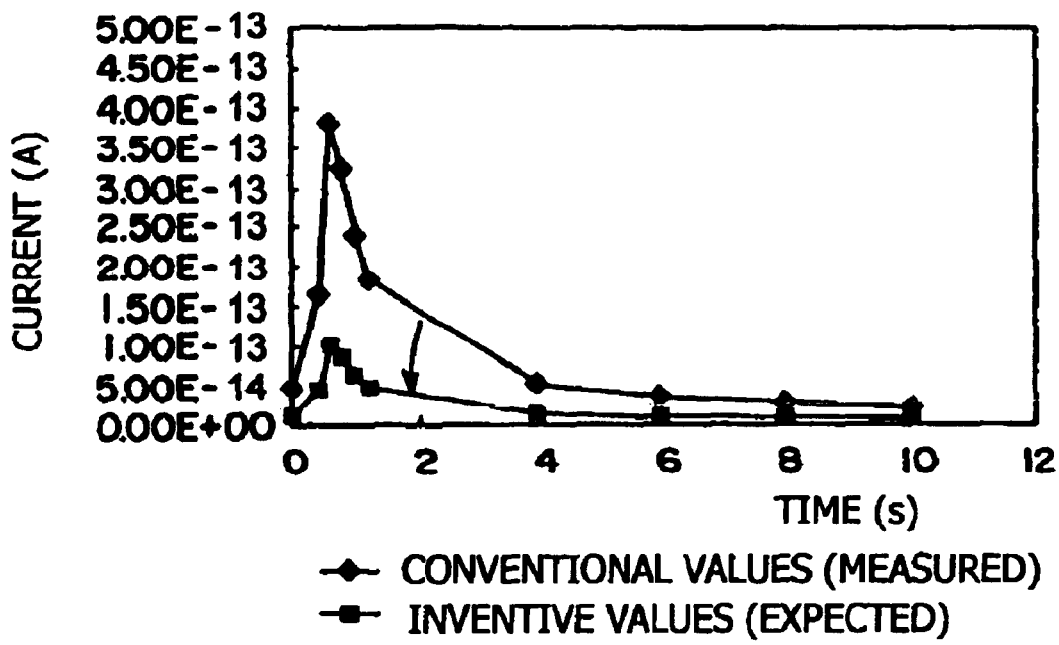
FIGS. 5(a) and 5(b) are graphs of settling characteristics based on a comparison between expected value of the blade-like connecting needle according to the present invention and measured values of a conventional blade-like connecting needle.
Figure 5B:
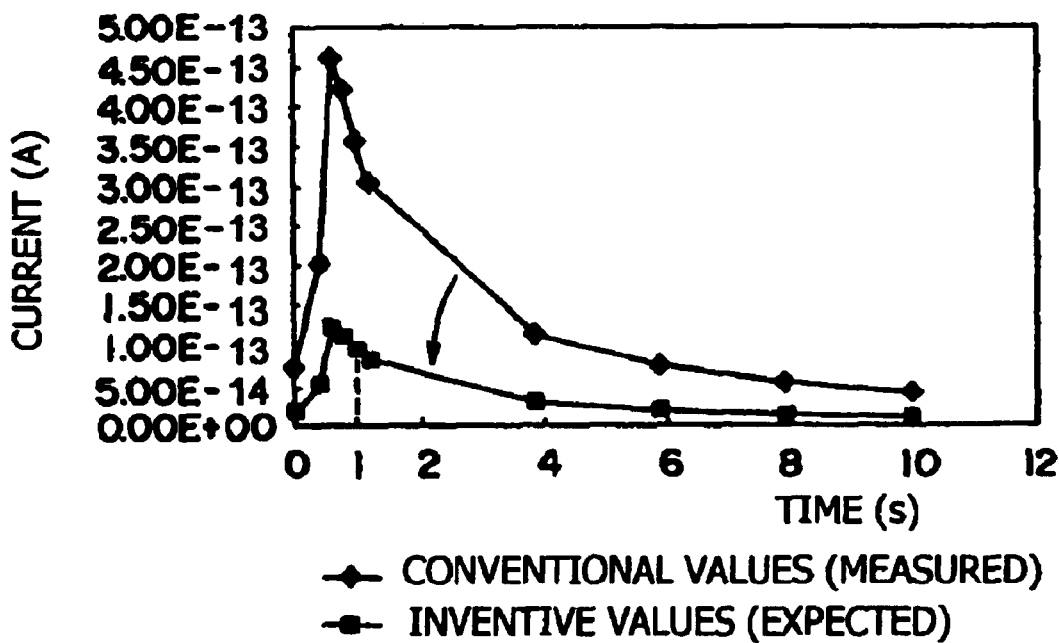

An effect produced when the blade-like connecting needle is contaminated during measurements on semiconductor wafers will be described below with reference to FIGS. 5(a) and 5(b), which are graphs of settling characteristics. The data shown in FIGS. 5(a) and 5(b) represent current values after applying of a step voltage of 10 V, and indicate measured values of the conventional blade-like connecting needle and expected values of the blade-like connecting needle according to the present invention. FIG. 5(a) shows the data when a signal output pin is a 14th pin, and FIG. 5(b) shows the data when a signal output pin is a 24th pin. In FIG. 5(a), the time that elapses until the current value becomes 100 fA or less after the voltage is changed by 10 V is about 3 seconds with the conventional blade-like connecting needle, but 1 second or less with the blade-like connecting needle according to the present invention. Similarly, in FIG. 5(b), the time that elapses until the current value becomes 100 fA or less after the changing of 10 V is about 4 seconds or more with the conventional blade-like connecting needle, but about 1 second with the blade-like connecting needle according to the present invention. FIG. 5(b) for the 24th pin indicates that a current of 42 fA continues to flow even after the elapse of 10 seconds. In this case, the measurement of a current on the order of fA cannot be started unless a waiting time of several tens of seconds is additionally spent. If the blade-like connecting needle is significantly contaminated, then the current may not fall to a value of the order of 10 fA, making it impossible to measure the current.

Figure 6A:
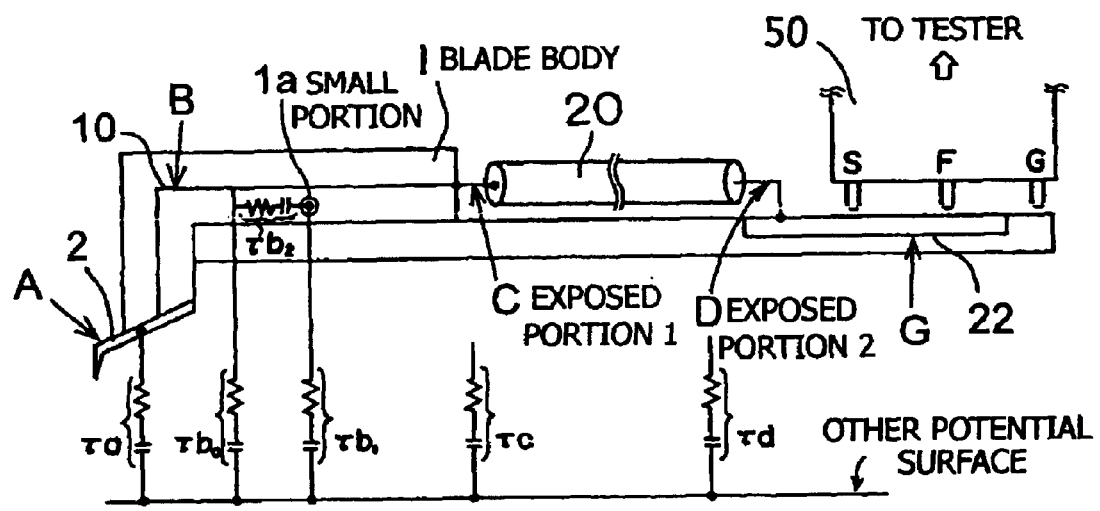
FIGS. 6(a) and 6(b) are circuit diagrams of hypothetical circuits for determining effects of the blade-like connecting needle according to the present invention and the conventional blade-like connecting needle.

A model used to produce the settling characteristics, shown in FIGS. 5(a) and 5(b), of the blade-like connecting needle according to the present invention will be described below with reference to FIGS. 6(a) and 6(b). As shown in FIG. 6(a), a region where a blade signal line is exposed can be considered as having a capacitive coupling and a resistor in each of four areas A, B, C, D. Settling times (time constants) due to the capacitive coupling and the resistor in the air in the areas A, B, C, D are represented respectively by $\tau_a$, $\tau_{b0}$ and $\tau_{b1}$, $\tau_c$, and $\tau_d$. These settling times (time constants) are usually much faster than $\tau_{b2}$ which represents a sum of settling times due to capacitive couplings through small regions on the blade. The dielectric characteristics of the sum $\rho_{b2}$ of settling times are usually most influential. While such regions are also present in the other areas A, C, D, they are less influential than $\tau_{b2}$ in view of the continuity of the material.

The overall settling time (time constant) $\tau$ of the model can be expressed using the settling times (time constants) $\tau_a$, $\tau_{b0}$ and $\tau_{b1}$, $\tau_c$, and $\tau_d$ through the air in the areas A, B, C, D, as follows:

$$\tau_a + \tau_{b0} + \tau_c + \tau_d << \tau \leq \tau_a + \tau_{b0} + \tau_{b1} + \tau_{b2} + \tau_c + \tau_d$$

If the coupling distance through the air is constant, then the capacitive couplings per unit length of respective signal portions are equal to each other, and the capacitive couplings in the respective areas A, B, C, D are proportional to the length of respective exposed portions of the signal line. This is because if the settling time (time constant) in the circuit of the model is represented by T, the capacitance thereof C, and the resistance thereof R, then T∝CR, indicating that the capacitance C and the settling time (time constant) T are proportional to each other. If the lengths of the respective areas A, B, C, D are indicated by $L_a$, $L_b$, $L_c$, $L_d$, respectively, then in view of the fact that the overall settling time (time constant) $\tau$ of the model is at least proportional to these lengths ($\tau_a \propto L_a$, $\tau_b \propto L_b$, $\tau_c \propto L_c$, $\tau_d \propto L_d$), the overall settling time (time constant) $\tau$ is expressed as:

$$\tau >> \tau_a + \tau_{b0} + \tau_c + \tau_d \propto L_a + L_b + L_c + L_d$$

Figure 6B:
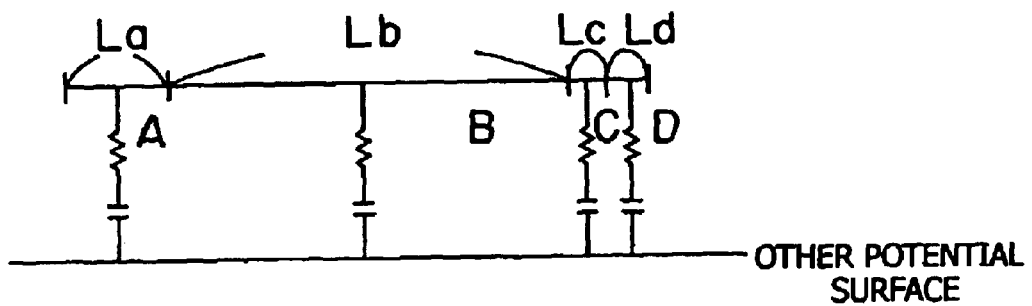

This relationship is illustrated in FIG. 6(b). The measured values of these lengths of the respective areas A, B, C, D were $L_a$=8 mm, $L_b$=22 mm, $L_c$=2 mm, $L_d$=2 mm, respectively.

The effect of the coaxial blade is estimated from the above model. As described above, if the settling time (time constant) is represented by T, the capacitance thereof C, and the resistance thereof R, then since the capacitance C and the settling time (time constant) T are proportional to each other, the settling time (time constant) T can be expected from a change in the capacitance C. A value (expected value) that estimates the effect of the coaxial blade as a very small level can be derived by comparing with a situation where the length $L_b$ is 0 mm. If the coefficient value (expected value) is represented by η, then it can be expected to be equal to or smaller than:

$$\eta = (L_a + L_c + L_d)/(L_a + L_b + L_c + L_d) = 12/34 = 35.3\%$$

Since the examples shown in FIGS. 5(a) and 5(b) are based on the measurement of a total contribution of the probe and the blade signal line, in worst cases, the coefficient value (expected value) η can be expected to be equal to or smaller than 26.7%, which is found as follows:

$$\eta = L_a/(L_a + L_b) = 8/(8+22) = 26.7\%$$

Figure 7A:
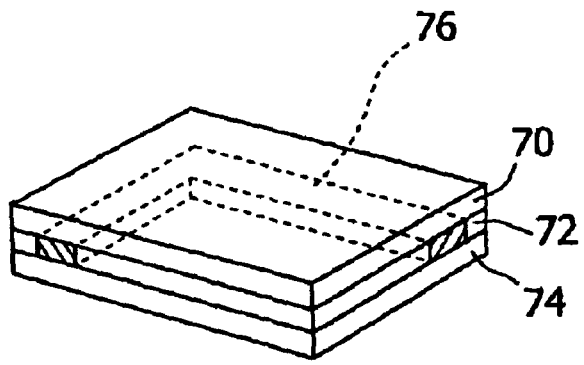
FIGS. 7(a) and 7(b) are perspective views showing a process of producing the blade-like connecting needle according to the present invention.
Figure 7B:
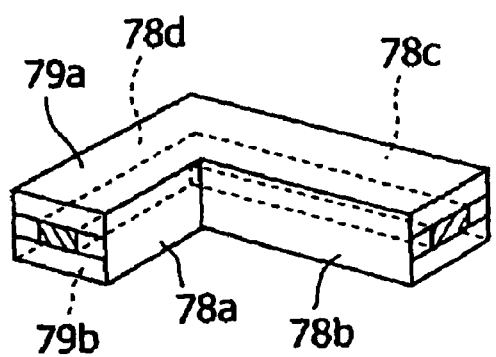

Processes of producing the blade-like connecting needle according to the present invention will be described below. Since the process of producing the blade-like connecting needle by bonding two members to each other has already been described above, other processes of producing the blade-like connecting needle will be described below. FIGS. 7(a) and 7(b) are illustrative of a process of producing the blade-like connecting needle from multilayer plates by way of routing and end-face plating. As shown in FIG. 7(a), an internal wire 76 is placed between multilayer-plate insulators 70, 72, 74 as a base material, and then the multilayer-plate insulators 70, 72, 74 are machined to a desired shape by routing. Finally, as shown in FIG. 7(b), sides 78a, 78b, 78c, 78d of a multilayer base are plated with metal, forming a coaxial blade-like connecting needle which has surfaces 79a, 79b covered with guard patterns by plating or the like.

Figure 8A:
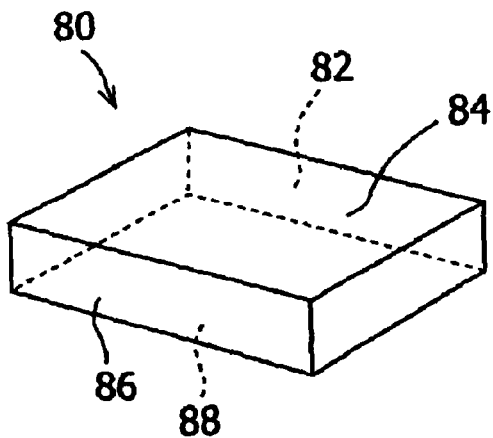
FIGS. 8(a) and 8(b) are perspective views showing another process of producing the blade-like connecting needle according to the present invention.
Figure 8B:
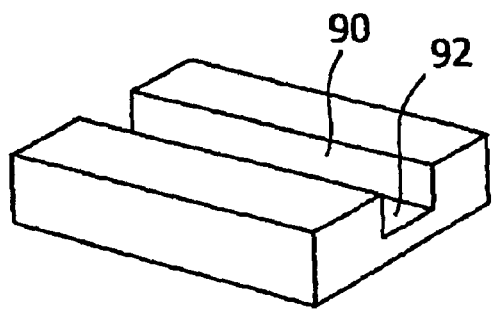
Figure 9:
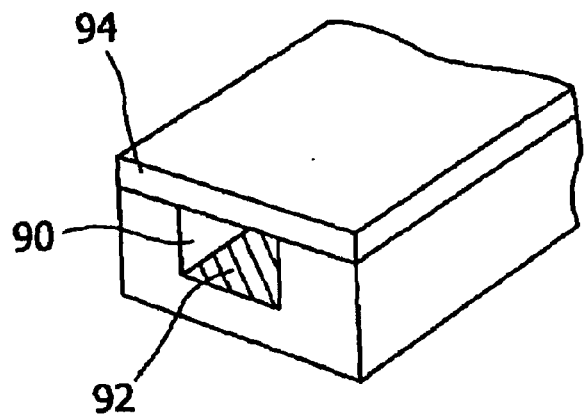
FIG. 9 is a fragmentary perspective view showing the other process of producing the blade-like connecting needle according to the present invention.
Figure 10:
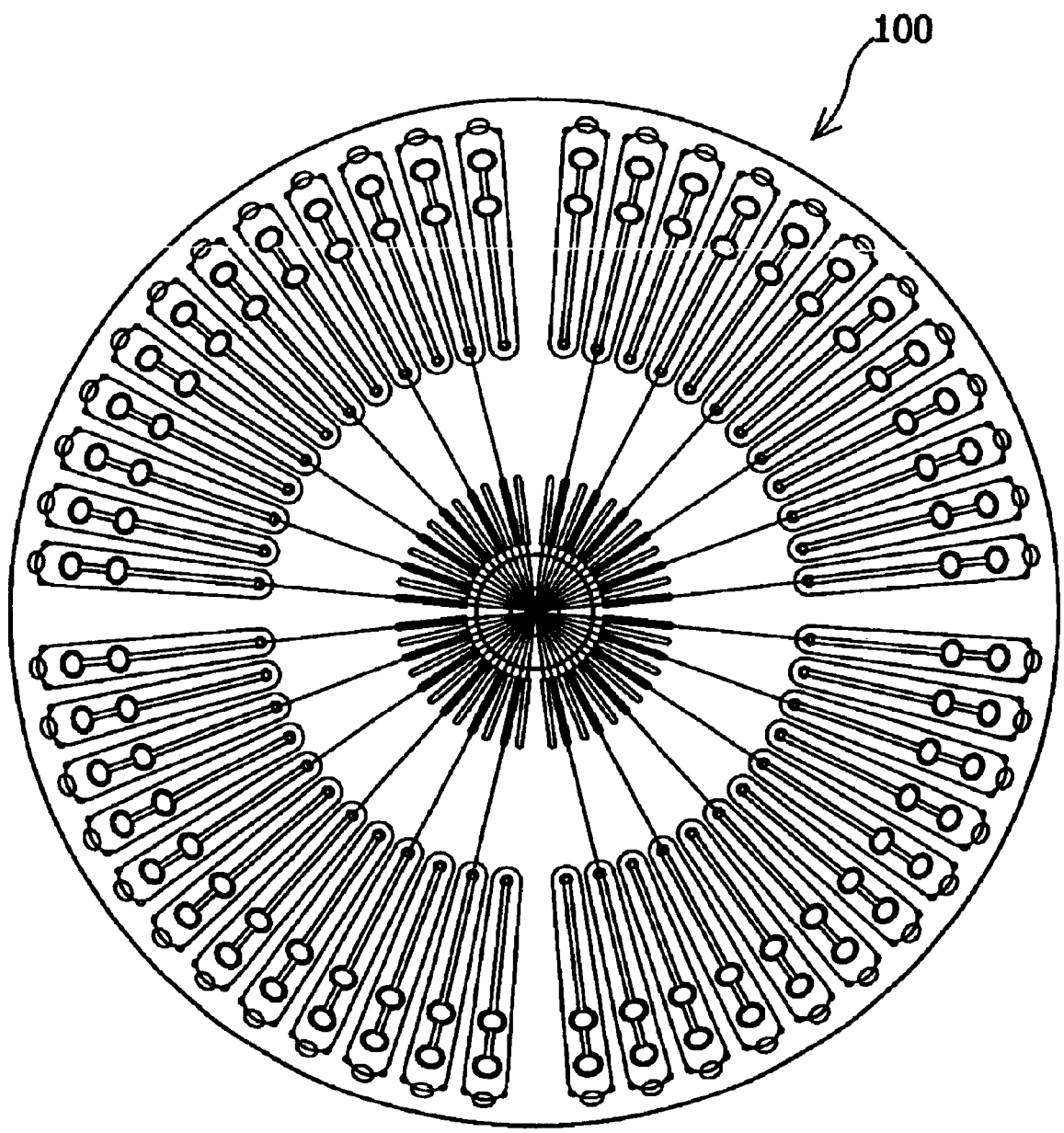
FIG. 10 is a plan view of a conventional probe card.
Figure 11:
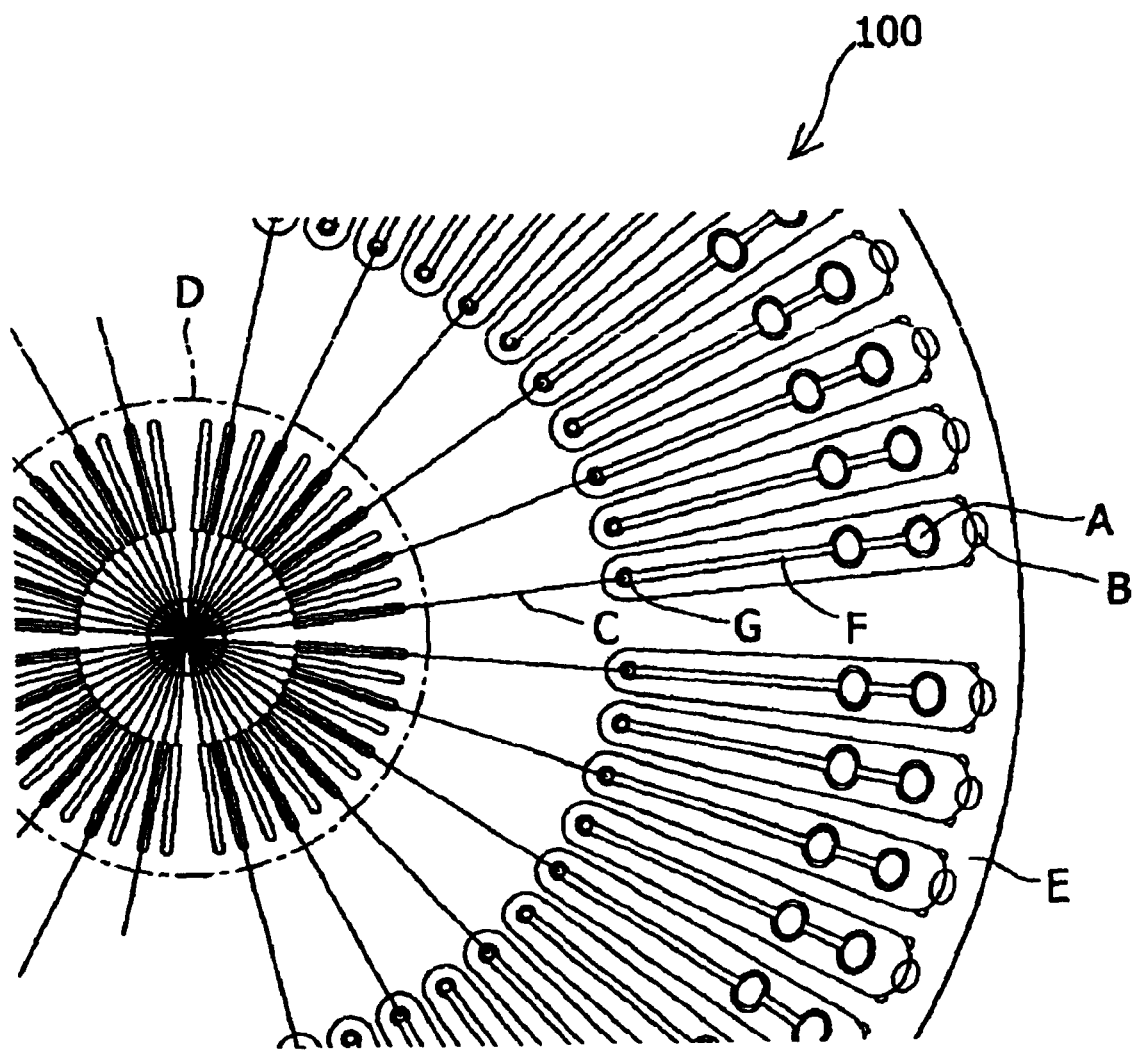
FIG. 11 is an enlarged fragmentary plan view of the conventional probe card shown in FIG. 10.
Figure 12A:
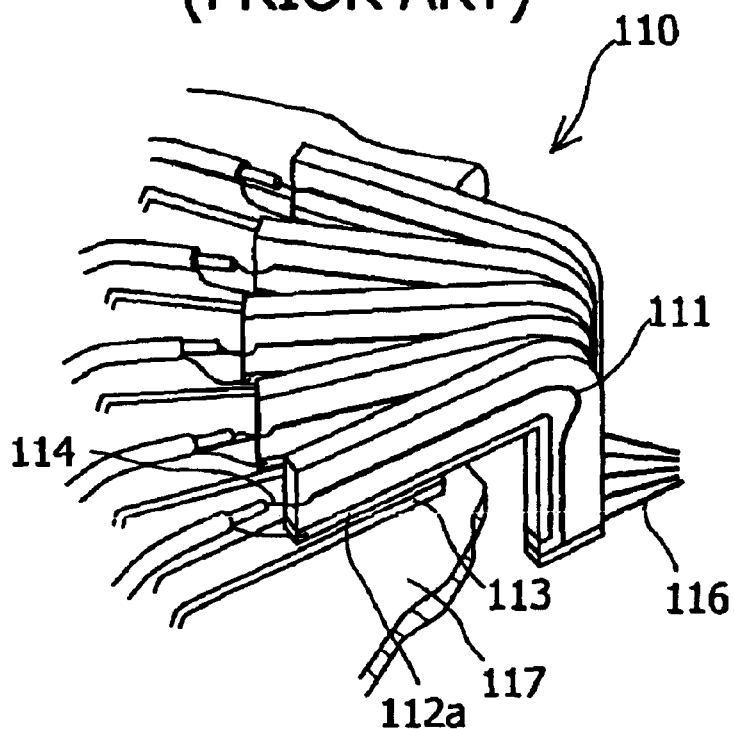
FIG. 12(a) is a fragmentary perspective view of conventional blade-like connecting needles, showing face sides thereof.
Figure 12B:
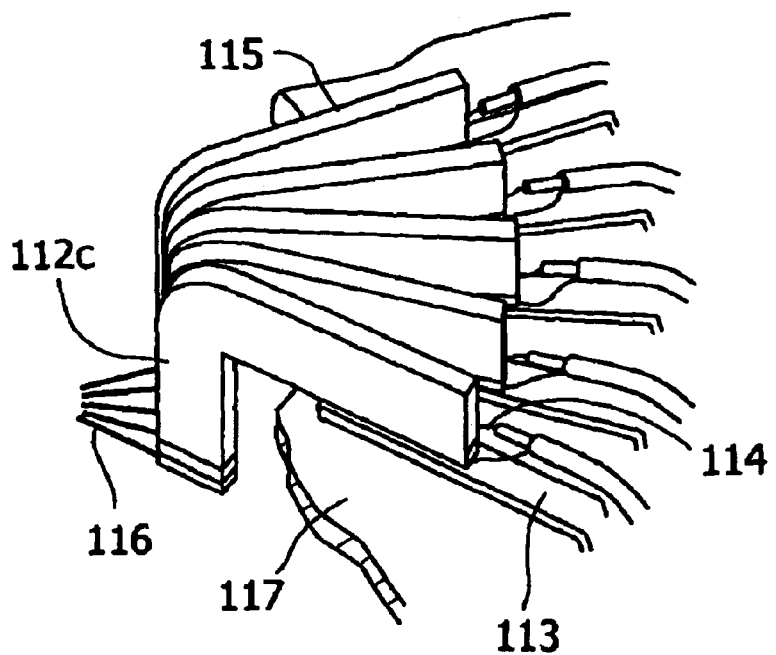
FIG. 12(b) is a fragmentary perspective view of the conventional blade-like connecting needles, showing back sides thereof.
Figure 13:
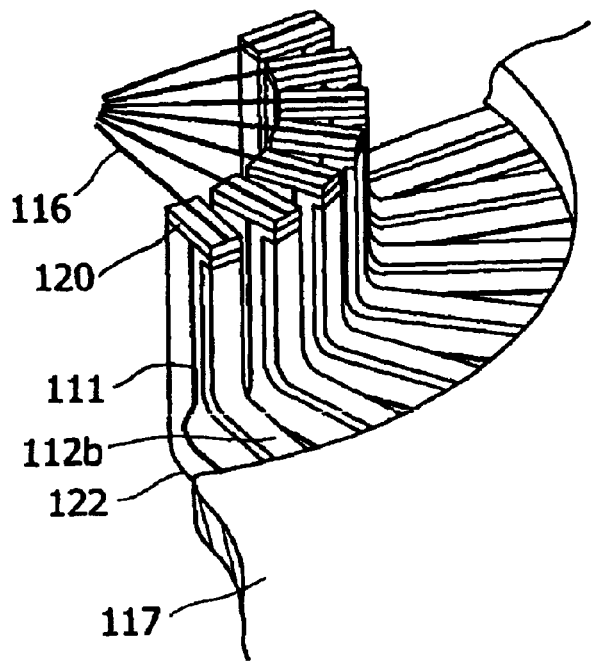
FIG. 13 is a fragmentary perspective view of the conventional blade-like connecting needles, as viewed from a wafer connection side thereof.
Figure 14:
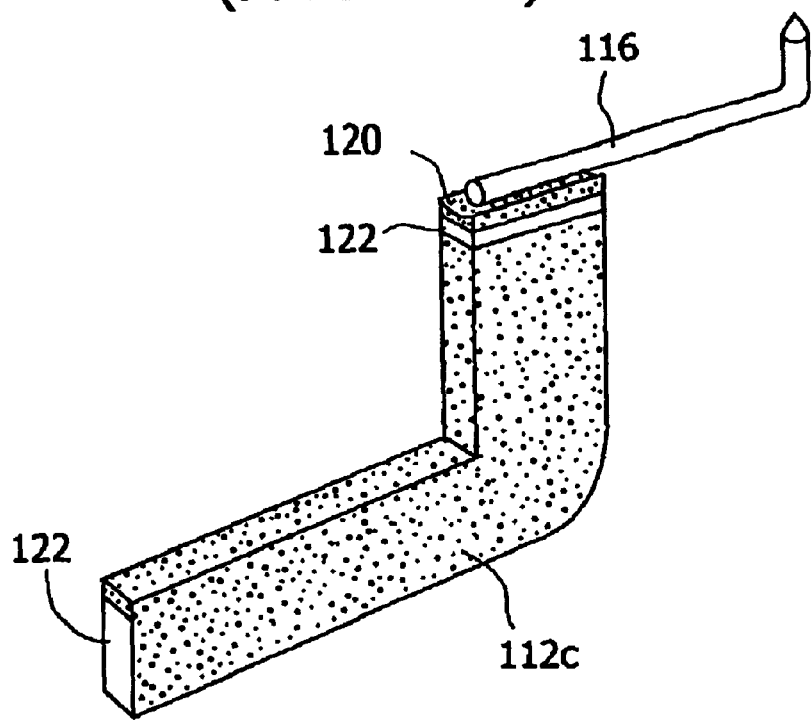
FIG. 14 is a perspective view of a conventional blade-like connecting needle, showing one side thereof.
Figure 15:
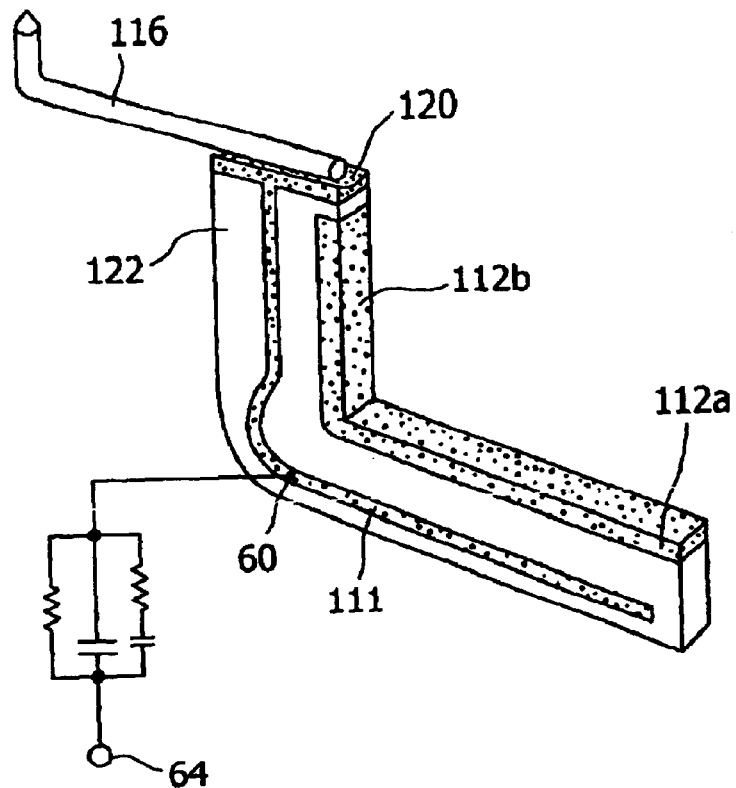
FIG. 15 is a perspective view of the conventional blade-like connecting needle, showing an opposite side thereof.

A process of producing the coaxial blade-like connecting needle according to the present invention from a base and a lid by way of routing, four-face plating, slotting, and bottom-face plating will be described below with reference to FIGS. 8(a), 8(b), and 9. First, a base 80 shown in FIG. 8(a) is machined to a desired shape by routing, and then four sides 82, 84, 86, 88 of the base 80 are plated. Thereafter, as shown in FIG. 8(b), the base 80 is slotted to form a groove 90 therein, and the bottom 92 of the groove 90 is plated. Then, as shown in FIG. 9, a metal lid 94 is attached to close the groove 90, thus forming a hollow coaxial blade-like connecting needle.

The blade-like connecting needle can also be produced by an IC fabrication process which may be one of epitaxy, etching, metallization, CMP, etc.

If the blade insulator is made of a material such as PTFE which is of better dielectric characteristics than ceramics, then the resultant blade-like connecting needle provides somewhat good characteristics even if no guard can be used or if a passive guard is used. The conventional blade insulator of ceramics poses no problem at present. Even if the blade-like connecting needle is used as a bias path (the guard is normally at the ground potential) before a small current is measured, a waiting time required to switch different between applications can be shortened by selecting a good insulator as described above. By using a general-purpose blade fabrication process to realize a complete guard structure, it is possible to incorporate, into a probe card, another circuit network which could not conventionally be introduced in view of a possible degradation of small current characteristics. Compared with the less reliable coaxial structure using a needle, the blade-like connecting needle which provides its coaxial structure using a blade according to the present invention can easily be handled, and can quickly be repaired inexpensively should it be damaged. The cost of management and the cost of transportation for the blade-like connecting needle according to the present invention can also be reduced. Since the blade-like connecting needle is compatible with the conventional blade-like connecting needle, the customer can regard the blade-like connecting needle as a simple higher-level compatible device, and the conventional blade-like connecting needle can be unified with the blade-like connecting needle according to the present invention.

The complete guard structure according to the first and second embodiments is capable of reducing a measurement waiting time due to the dielectric absorption of an insulating material which would be present between the signal line and another potential, to a negligible level. Since no insulating material is present, of which one end is connected to the signal line and the other end is connected to the other potential, no characteristic variations which might be caused by such an insulating material are present. The fully guarded structure provides good insulating characteristics under severe conditions such as high temperature, high humidity, etc.

The blade-like connecting needle of the above structure can be produced according to a usual blade fabrication process, the blade-like connecting needle can stably be manufactured inexpensively. Furthermore, since the blade-like connecting needle according to the present invention is of substantially the same dimensions as the conventional blade-like connecting needle, the blade-like connecting needle according to the present invention does not need to be of a special material and a special shape. Therefore, the blade-like connecting needle according to the present invention is compatible with the conventional blade-like connecting needle.

The entire disclosure of Japanese Patent Application No. 2001-114861 filed on Apr. 13, 2001 including the specification, claims, drawings and summary are incorporated herein by reference in its entirety.

What is claimed is:

1. A blade-like connecting needle for measuring a semiconductor wafer, comprising:
   a blade signal line for transmitting signal from the semiconductor wafer,
   a support insulator covering an entire outer circumference of said blade signal line,
   a plurality of blade guard patterns disposed at least on a portion of a surface of said support insulator for electromagnetically shielding said blade signal line, and
   a probe supported by said support insulator and connected to said blade signal line.

2. A blade-like connecting needle according to claim 1, wherein at least a portion of said probe is covered with an insulating material.

3. A blade-like connecting needle according to claim 1, further comprising a connector for connecting said blade signal line to an external circuit.

4. A blade-like connecting needle according to claim 3, wherein said connector includes in at least a portion thereof a signal line covered with an insulating material.

5. A blade-like connecting needle according to claim 1, wherein the blade like connecting needle is connected to a probe card including a shielded electric conductive path.

* * * * *